United States Patent [19]
Nakashiba

[11] Patent Number: 5,914,506
[45] Date of Patent: *Jun. 22, 1999

[54] CHARGE COUPLED DEVICE HAVING TWO-LAYER ELECTRODES AND METHOD OF MANUFACTURING THE SAME

[75] Inventor: Yasutaka Nakashiba, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/657,114

[22] Filed: Jun. 3, 1996

[30] Foreign Application Priority Data

Jun. 2, 1995 [JP] Japan ................................. 7-136245

[51] Int. Cl.$^6$ ................................................. H01L 29/768
[52] U.S. Cl. ........................................... 257/221; 257/248
[58] Field of Search ........................... 257/221, 246–248, 257/251

[56] References Cited

U.S. PATENT DOCUMENTS

| | | | |
|---|---|---|---|
| 3,745,383 | 7/1973 | Sangster | 257/251 |
| 3,789,267 | 1/1974 | Krambeck et al. | 257/248 |
| 3,852,799 | 12/1974 | Walden | 257/248 |
| 4,157,558 | 6/1979 | Weckler | 257/248 |
| 4,621,369 | 11/1986 | Narabu et al. | 257/221 |
| 4,709,380 | 11/1987 | Itoh | 257/251 |
| 5,315,137 | 5/1994 | Asaumi et al. | 257/221 |
| 5,402,459 | 3/1995 | Hynecek | 257/247 |
| 5,521,405 | 5/1996 | Nakashiba | 257/248 |
| 5,796,801 | 8/1998 | Nakashiba | 257/248 |

FOREIGN PATENT DOCUMENTS

| | | | |
|---|---|---|---|
| 61-184876 | 8/1986 | Japan . | |
| 61-184877 | 8/1986 | Japan . | |
| 6-314706 | 11/1994 | Japan | 257/248 |

OTHER PUBLICATIONS

An Overlapping Electrode Buried Channel CCD; D. M. Erb et al. International Electron Devices Meeting, Dec. 1973, pp. 24–26.

Two–Phase Charge Coupled Linear Imaging Devices with Self–Aligned Implanted Barrier; Choong–Ki Kim ; International Electron Devices Meeting, Dec. 1974, pp. 55–58.

*Primary Examiner*—Gene M. Munson

[57] ABSTRACT

A charge coupled device has a plurality of N-diffused regions and a plurality of N$^-$diffused regions arranged alternately along a charge transfer channel. A first electrode and second electrode overlying each N-diffused region and N$^-$-diffused region form a pair of electrodes, four of which form a group of electrodes iteratively appearing along the charge transfer channel. Each first pair and each third pair are connected to a first signal line and second signal line, respectively, which receive two-phase driving clock signals, while each second pair and fourth pair are connected to a fixed potential line maintained at a middle potential between the high level and low level of the driving signals. A high-speed transfer of signal charges is obtained in the two-phase type charge coupled device.

4 Claims, 8 Drawing Sheets

CHARGE COUPLED DEVICE HAVING TWO-LAYER ELECTRODES AND METHOD OF MANUFACTURING THE SAME

BACKGROUND OF THE INVENTION (a). Field of the Invention

The present invention relates to a charge coupled device having two-layer electrodes and, more particularly, to a charge coupled device of a two-phase driven/two-layer electrode type for use in a solid-state imaging device. The present invention also relates to a method for manufacturing such a charge coupled device.

(b). Description of the Related Art

Figure 1:
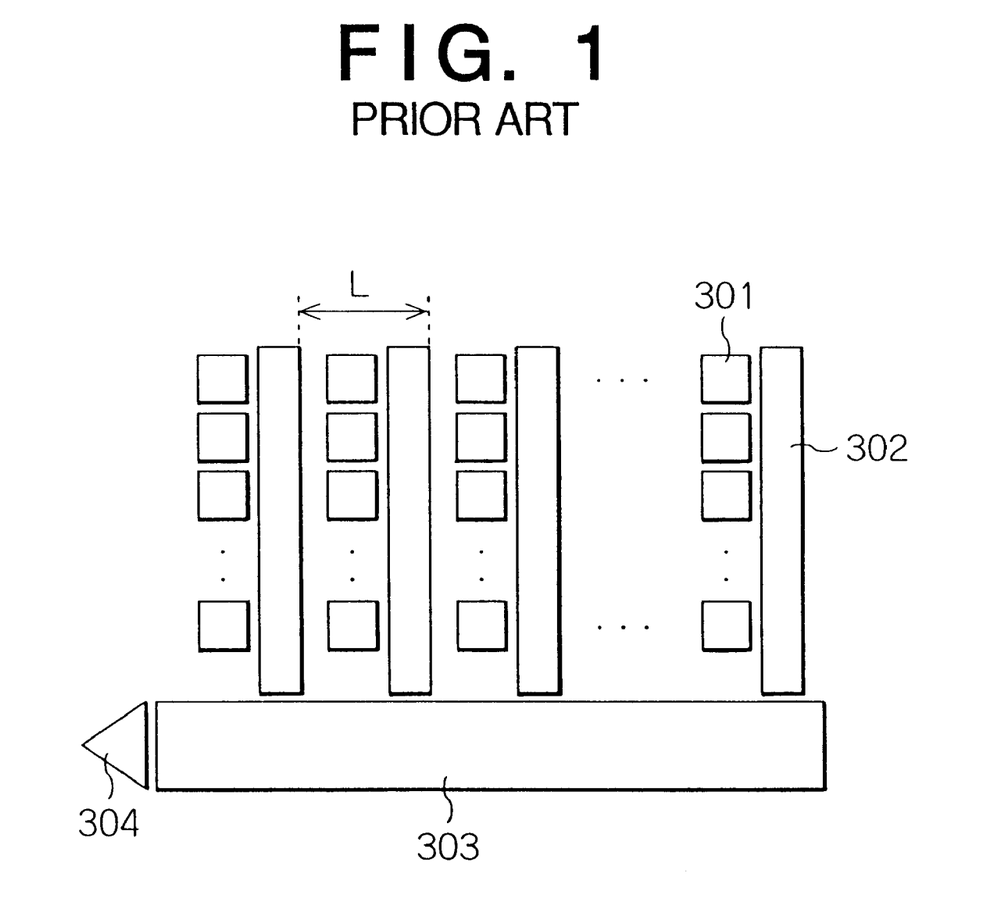
FIG. 1 is a schematic plan view of a general configuration of a solid-state imaging device including a charge coupled device.

Referring first to FIG. 1, there is shown a plan view of a general configuration of a solid-state imaging device. In FIG. 1, each of photoelectric transducer 301 arranged in a matrix converts incident light supplied thereto into a signal charge corresponding to the quantity of the incident light. The resultant signal charge is firstly read out to a vertical charge transfer section 302, and then transferred through a horizontal charge transfer section 303 so that output image signals are fed out from an output circuit 304.

FIGS. 2A to 2D show the steps of a manufacturing process for a first conventional charge coupled device of a buried channel/two-phase driven/two-layer electrode type, which is used in the horizontal charge transfer section of a solid-state imaging device of the type described above (see IEDM Technical Digest, 1973, pp. 24 and IEDM Technical Digest, 1975, pp. 55). The structure of the first conventional charge coupled device will be described by way of the steps of the manufacturing process.

Figure 2A:
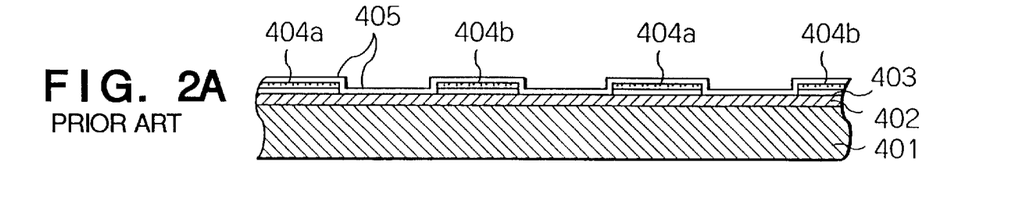
FIGS. 2A to 2D are cross sectional views consecutively showing the steps of a process for manufacturing a first conventional charge coupled device.

Referring first to FIG. 2A, in a P-type (first conductivity type) semiconductor substrate 401, an N-type (second conductivity type) semiconductor layer 402 is formed by an ion implantation technique or the like. Then, N-type semiconductor layer 402 is subjected to a thermal oxidation to form a first insulating film 403 thereon. Then, a metallic pattern of first charge transfer electrodes 404a and 404b is formed on the first insulating film 403 by using a known sputtering and patterning technique. Subsequently, first insulating film 403 is selectively removed by using the pattern of first charge transfer electrodes 404a and 404b as a mask, followed by a second thermal oxidation to form a second insulating film 405 on the entire surface of the substrate to cover first charge transfer electrodes 404a and 404b and the N-type semiconductor layer 402.

Figure 2B:
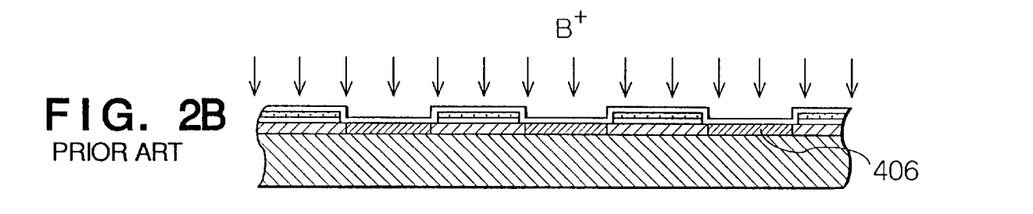

Subsequently, P-type impurity ions (e.g., boron ions B$^+$) are lightly implanted into regions of N-type semiconductor layer 402 located between each two of the first charge transfer electrodes 404a and 404b, thereby forming N$^-$-diffused regions 406 in self-alignment with first charge transfer electrode 404a and 404b (see FIG. 2B).

Figure 2C:
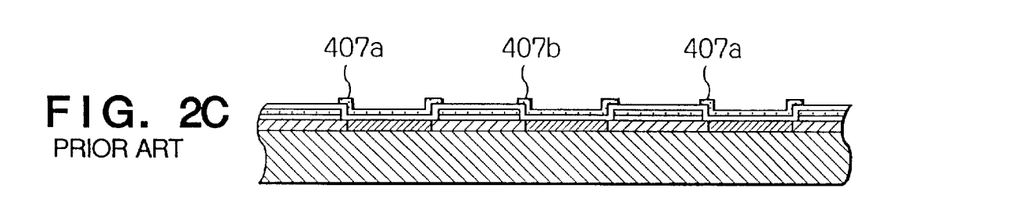
Figure 2D:
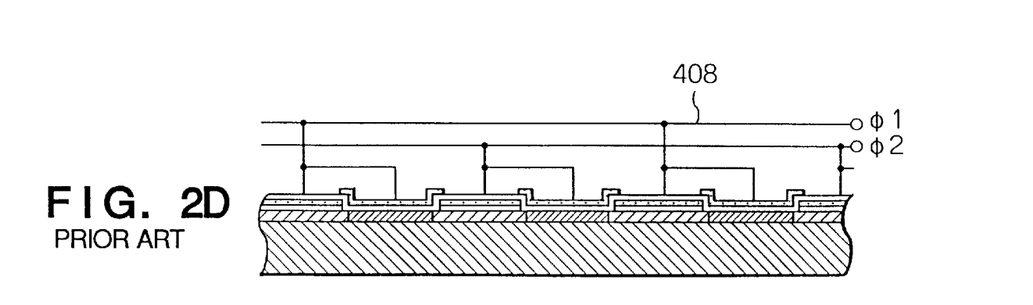

Thereafter, a pattern of second charge transfer electrodes 407a and 407b is formed on the surface of the second insulating film 405 by using a known sputtering and patterning technique such that each of the second charge transfer electrodes 407a and 407b covers a corresponding N$^-$-diffused region 406 and the edge portions of first charge transfer electrodes 404a and 404b (see FIG. 2C). Subsequently, by utilizing a known technique, an interlayer insulating film (not shown) is formed and then a metallic wiring pattern 408 constituting a pair of signal lines for receiving two-phase driving signals is formed thereon.

Charge transfer electrodes 404a and 404b are connected to the pair of signal lines in such a way that each of the first charge transfer electrodes, e.g., 404a, and corresponding one second charge transfer electrodes, e.g., 407a, located adjacent to it are connected together to one of the signal line, thereby forming an electrode pair. If one numbers the plurality of pairs from one end, odd numberred pairs are connected to a first signal line to which a first signal $\phi 1$ is supplied, and even numberred pairs are connected to a second signal line to which a second signal $\phi 2$ is supplied, or vice versa. In this manner, the plurality of pairs of charge transfer electrodes are connected alternately to the first and second signal lines. Thus, the first conventional charge coupled device of a two-phase driven/two-layer electrode type is obtained (see FIG. 2D).

The operation of the first conventional charge coupled device will now be described with reference to FIGS. 3A to 3E. Referring first to FIG. 3A showing again the structure of the first charge coupled device, the charge coupled device having first charge transfer electrodes denoted by numeral 501a and 501b, second charge transfer electrodes denoted by numerals 502a and 502b, N-diffused regions denoted by numeral 503, N$^-$-diffused regions denoted by numeral 504, and a P-type semiconductor substrate denoted by numeral 505.

Figure 3A:
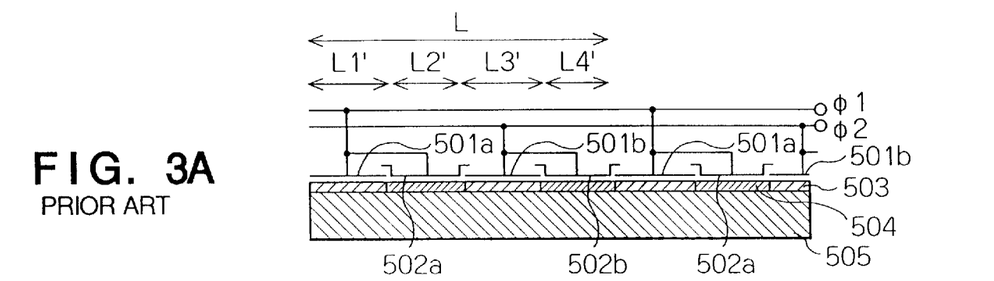
FIG. 3A is a schematic cross-sectional view of the first conventional charge coupled device manufactured by the steps of FIGS. 2A to 2D.

The channel regions 503 and 504 underlying each odd numberred pair of first and second charge transfer electrodes 501a and 502a are connected to the first signal line $\phi 1$ and are designated by L1' and L2', respectively. The channel regions 503 and 504 underlying each even numberred pair of first and second charge transfer electrodes 501b and 502b connected to the second signal line $\phi 2$ are designated by L3' and L4', respectively. A channel region group L including channel regions L1' to L4' appears iteratively along the buried charge transfer channel.

Figure 3B:
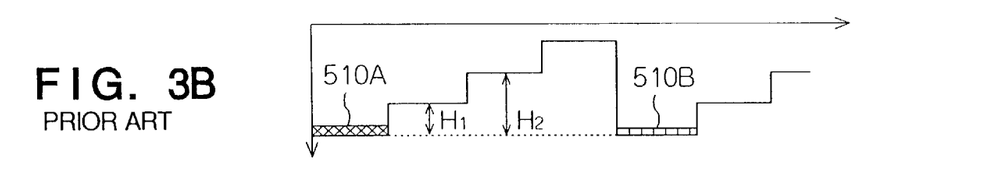
FIGS. 3B to 3D are diagrams showing potential distribution in the charge transfer channel in the charge coupled device of FIG. 3A.
Figure 3C:
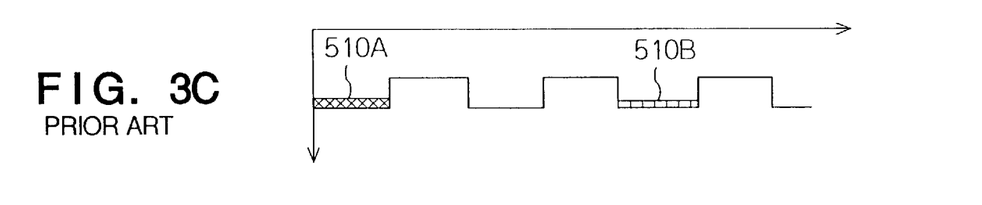
Figure 3D:
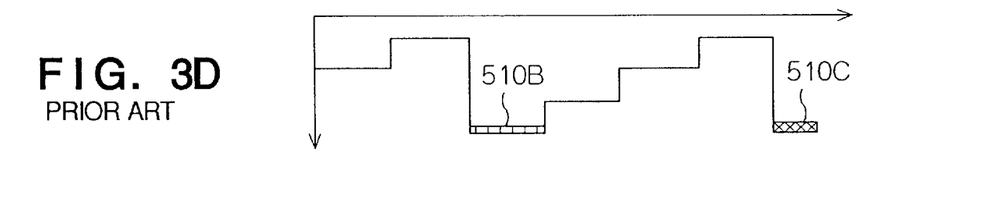
Figure 3E:
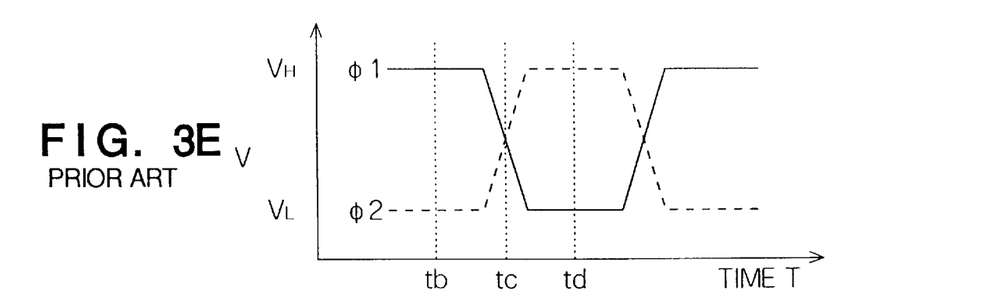
FIG. 3E is a timing chart of two-phase driving signals for the charge coupled device of FIG. 3A.

FIGS. 3B to 3D show potential distributions at different time instants along the buried channel in the charge coupled device of FIG. 3A while showing each channel region in correspondence with the location thereof. FIG. 3E shows a timing chart for signal levels of two-phase driving signals $\phi 1$ and $\phi 2$, and FIGS. 3B, 3C and 3D correspond to time instants tb, tc and td in FIG. 3E, respectively.

At time instant tb, driving signals $\phi 1$ and $\phi 2$ are at an H-level $V_H$ and an L-level $V_L$. respectively. At this time, assuming that $P_{L1}$, $P_{L2}$, $P_{L3}$ and $P_{L4}$ are electric potentials at respective channel regions L1 to L4, the potential distribution is such that the relationship $P_{L1}<P_{L2}<P_{L3}<P_{L4}$ holds, as shown in FIG. 3B. The signal charges 510A and 510B are stored in channel regions L1 underlying first charge transfer electrodes 501a of the first pairs to which an H-level voltage $V_H$ are now applied. At time instant tc subsequent to tb, the levels of driving signals $\phi 1$ and $\phi 2$ are shifted to become substantially equal to each other at the middle potential. Due to the shifts in the electric potentials at the charge transfer electrodes, the potential distribution of the channel regions is changed so that the relationship $P_{L1}=P_{L3}<P_{L2}=P_{L4}$ holds, as shown in FIG. 3C. At this time, the signal charges 510A and 510B remain in channel regions L1. At time instant td, the levels of signals $\phi 1$ and $\phi 2$ shift to an L-level $V_L$ and to an H-level $V_H$, respectively, and the potential distribution of the channel regions is changed so that the relationship $P_{L3}<P_{L4}<P_{L1}<P_{L2}$ holds. As a result, the signal charges 510A and 510B are transferred towards channel regions L3' in which the deepest electric potentials are created by the overlying electrodes at which the H-level $V_H$ are now applied.

By iterating the above cycle, each of the signal charges 510A, 510B and 510C is transferred toward the left through channel regions L1' and L3'. Channel regions L2' and L4', in each of which a shallow electric potential is created by each of overlying second charge transfer electrodes 502a and 502b, are formed in order to prevent signal charges from flowing reversely and hence to restrict signal charges to be transferred only leftward in the drawings.

Figure 4A:
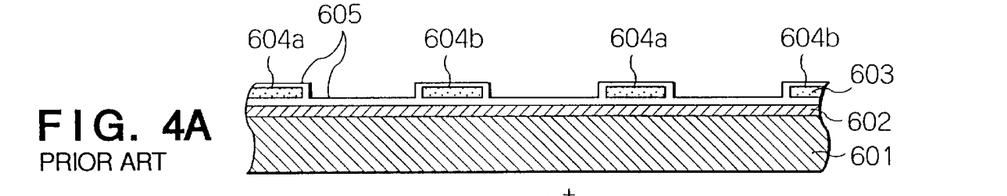
FIGS. 4A to 4E are cross-sectional views for showing, similarly to FIGS. 2A to 2D, manufacturing steps of a second conventional charge coupled device.

FIGS. 4A to 4E show the steps of a manufacturing process for a second conventional charge coupled device of a buried channel/two-phase driven/two-layer electrode type (see Patent Publication Nos. JP-A-61-184876 and JP-A-61-184877). Referring first to FIG. 4A, N-impurity ions are implanted into a P-type semiconductor substrate 601 to form an N-type semiconductor layer 602 therein, followed by a thermal oxidation to form a first insulating film 603 thereon.

Next, by utilizing a well known sputtering and patterning technique, a plurality of first charge transfer electrodes 604a and 604b are formed on the first insulating film 603 at a predetermined pitch. Subsequently, first insulating film 603 is selectively removed by using the pattern of first charge transfer electrodes 604a and 604b as a mask, followed by a second thermal oxidation to form a second insulating film 605 covering the entire surface including surfaces of first charge transfer electrodes 604a and 604b and the spaces therebetween.

Figure 4B:
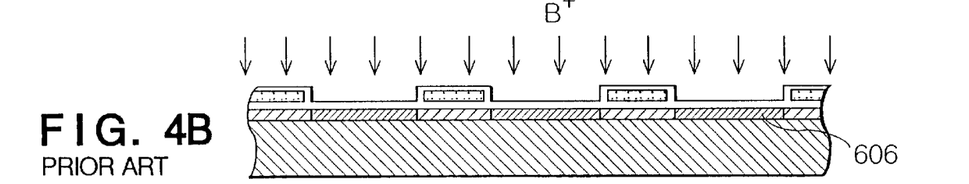

Subsequently, as shown in FIG. 4B, P-type impurity ions (e.g., boron ions B$^+$) are lightly implanted into regions of N-type semiconductor layer 602 between each two of first charge transfer electrodes 604a and 604b. As a result, N$^-$-diffused regions 606 are formed in self-alignment with first charge transfer electrodes 604a and 604b.

Figure 4C:
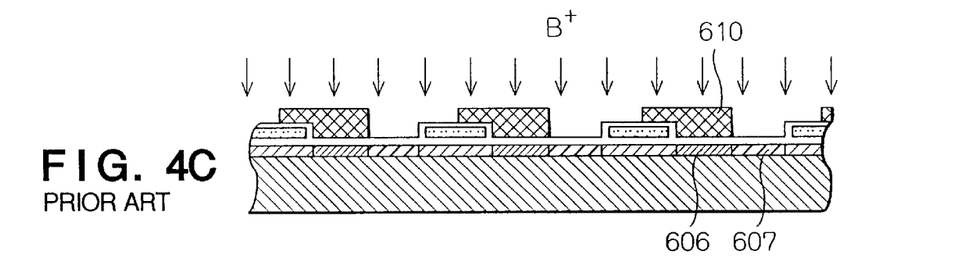

Thereafter, as shown in FIG. 4C, a photoresist pattern 610 is formed so as to cover an area extending from the central position, as viewed along the channel, of each of first charge transfer electrodes 604a and 604b to the central position of one of the N$^-$-diffused regions 606 adjacent to the each of first charge transfer electrodes. Then, P-type impurity ions (e.g., boron ions B$^-$) are lightly implanted into a part of each N$^-$-diffused region 606 by using photoresist pattern 610 as a mask to form N$^{--}$-diffused regions 607 each having an edge self-aligned with the edge of each of first charge transfer electrodes 604a and 604b.

Figure 4D:
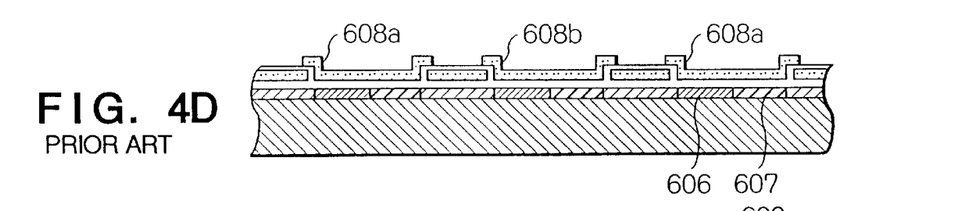

Subsequently, second charge transfer electrodes 608a and 608b are formed each overlying both N$^-$-diffused regions 606 and N$^{--}$-diffused regions 607, by a well known sputtering and patterning technique, such that the edge portions of second charge transfer electrodes 608a and 608b overlap with the edge portions of first charge transfer electrodes 604a and 604b (see FIG. 4D). As a result, a charge transfer electrode scheme is obtained in which the first electrodes and the second electrodes are alternately arranged one by one along the buried channel.

Figure 4E:
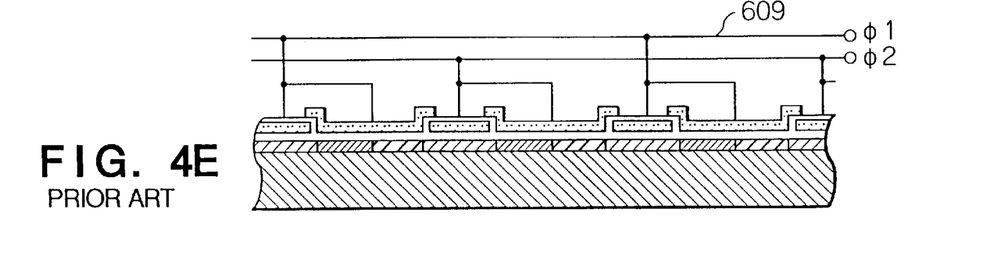

Thereafter, an interlayer insulating film (not shown) is formed by utilizing a known sputtering and patterning technique, followed by forming a metallic wiring pattern 609 constituting a pair of signal lines to which the two-phase driving signals φ1 and φ2 are applied. The charge transfer electrodes are connected such that each first charge transfer electrode 604a or 604b and a corresponding one of second charge transfer electrode 608a or 608b adjacent to each other are connected together to form a pair. Each pair is connected to the metallic wiring pattern 609 such that each odd numberred pair are connected to a first signal line (φ1), and each even numberred pair are connected to a second signal line (φ2). Thus, the second conventional charge coupled device of a two-phase driven/two-layer electrode type is obtained, as schematically shown in FIG. 4E.

Figure 5A:
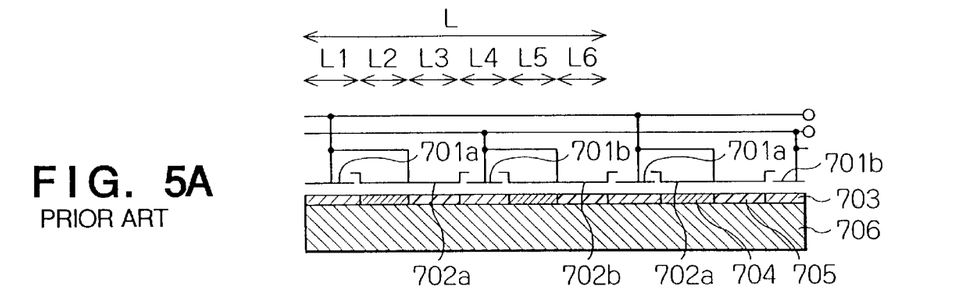
FIGS. 5A to 5E are a cross-sectional view, diagrams and a timing chart for showing, similarly to FIGS. 3A to 3E, respectively, operation of the second conventional charge coupled device.

The operation of the second conventional charge coupled device will now be described with reference to FIGS. 5A to 5E. FIGS. 5A to 5E show, similarly to FIGS. 3A to 3E, the structure and the operation of the second conventional charge coupled device. Referring first to FIG. 5A, the charge coupled device has a plurality of first charge transfer electrodes denoted by 701a and 701b, second charge transfer electrodes denoted by 702a and 702b, N-diffused regions denoted by 703, N$^-$-diffused regions denoted by 704, N$^{--}$-diffused regions denoted by 705, and a P-type silicon substrate denoted by 706. The charge transfer channel formed of three regions having different impurity concentrations, i.e., N-diffused regions, N$^-$-diffused regions and N$^{--}$-diffused regions provides an iterative potential distribution including six potential levels $P_{L1}$ to $P_{L6}$ at respective channel regions L1 to L6 forming a single channel group iteratively appearing along the buried channel.

Figure 5B:
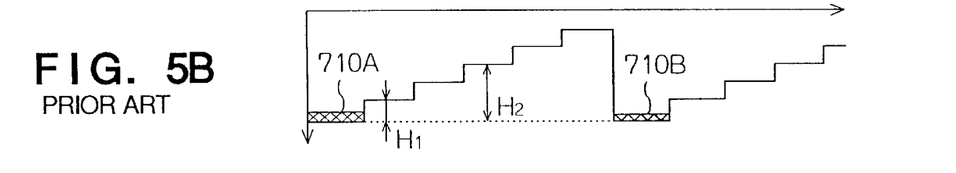

At time instant tb, driving signals φ1 and φ2 are shifted to an H-level $V_H$ and at an L-level $V_L$, respectively. At this time, the electric potentials of channel regions L1 to L6 are such that the relationship $P_{L1} < P_{L2} < P_{L3} < P_{L4} < P_{L5} < P_{L6}$ holds. Each of signal charges 710A and 710B is stored in a channel region L1 underlying the electrode to which the H-level is applied and therefore having the deepest electric potential among one channel group L.

Figure 5C:
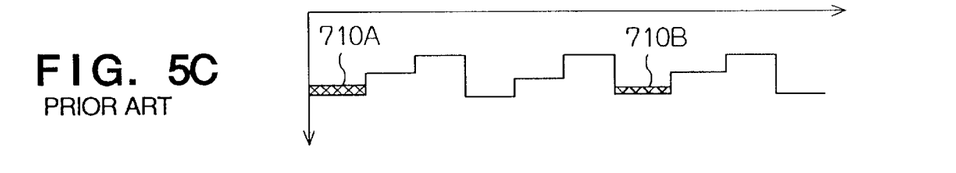
Figure 5D:
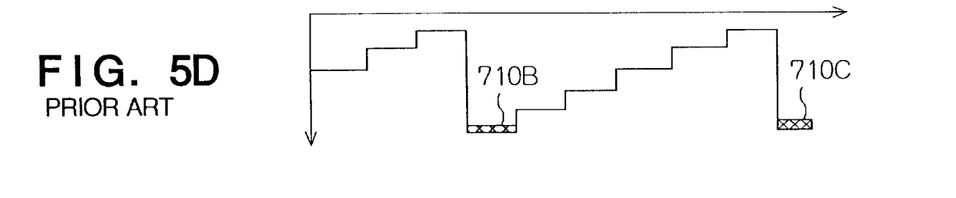
Figure 5E:
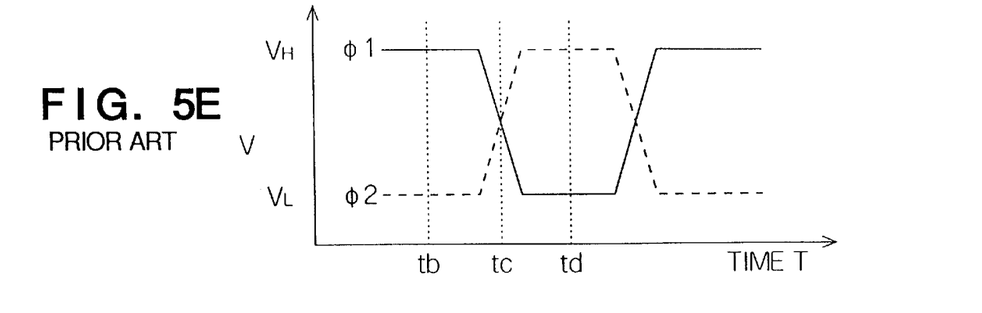

At time instant tc, driving signals φ1 and φ2 have an electric potential corresponding to a middle level between the H-level $V_H$ and the L-level $V_L$, and the electric potentials of channel regions L1 to L6 shift such that the relationship $P_{L1} = P_{L4} < P_{L2} = P_{L5} < P_{L3} = P_{L6}$ holds. At this time, the signal charges remain in channel regions L1. Subsequently, at time instant td, during which driving signals φ1 and φ2 are at a L-level $V_L$ and a H-level $V_H$, respectively, the electric potentials of channel regions L1 to L6 shift such that the relationship $P_{L4} < P_{L5} < P_{L6} < P_{L1} < P_{L2} < P_{L3}$ holds.

Each of the signal charges 710A, 710B and 710C is transferred leftward in the drawing towards a corresponding one of channel regions L4, which is now maintained at the deepest electric potential due to the potential distribution. Thereafter, by iterating these cycles, each of the signal charges 710A, 710B and 710C is transferred leftward in the drawing along the buried channel. Channel regions each having a shallow electric potential and underlying second charge transfer electrode 702a or 702b are provided in order to prevent signal charges from flowing in the reverse direction and hence to restrict signal charges to be transferred only to the left as viewed in the drawings.

In general, the time period required for transfer of signal charges along a charge coupled device increases exponentially with an increase in the gate length of each charge transfer electrode. More specifically, if the first conventional charge coupled device of a two-phase driven/two-layer electrode type is used as a horizontal transfer section of a solid-state imaging device such as shown in FIG. 1, the following problem occurs. In an imaging device having a long pixel pitch (L) in the horizontal direction, the large length of each charge transfer electrode, which depends on the pixel pitch L, requires a large time period for transfer of signal charges, resulting in a poor transfer efficiency.

The second conventional charge coupled device of a two-phase driven/two-layer electrode type was proposed so as to improve the poor transfer efficiency of the first conventional charge coupled device. In the second conventional device, six charge transfer electrodes provided within each horizontal pixel pitch L presents a smaller length of charge transfer electrode, which is about ⅔ of that of the first conventional charge coupled device having four charge transfer electrodes, so that the effective charge transfer speed is increased up to about ³⁄₂ times that of the first conventional device.

Figure 6:
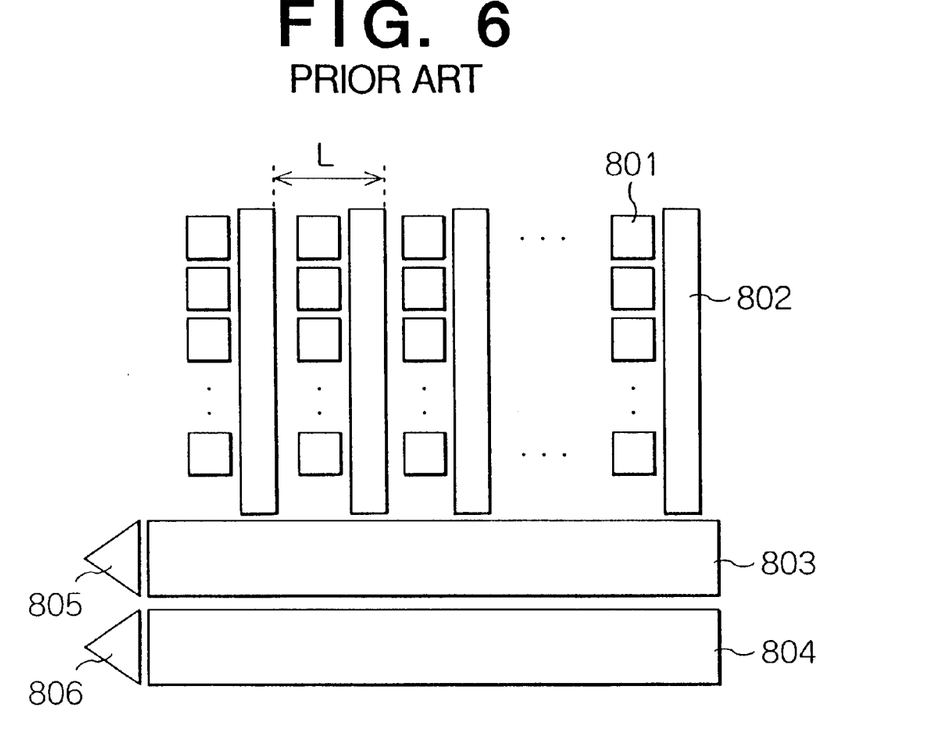
FIG. 6 is a schematic plan view of a general configuration of another solid-state imaging device having a third conventional charge coupled device.
Figure 7:
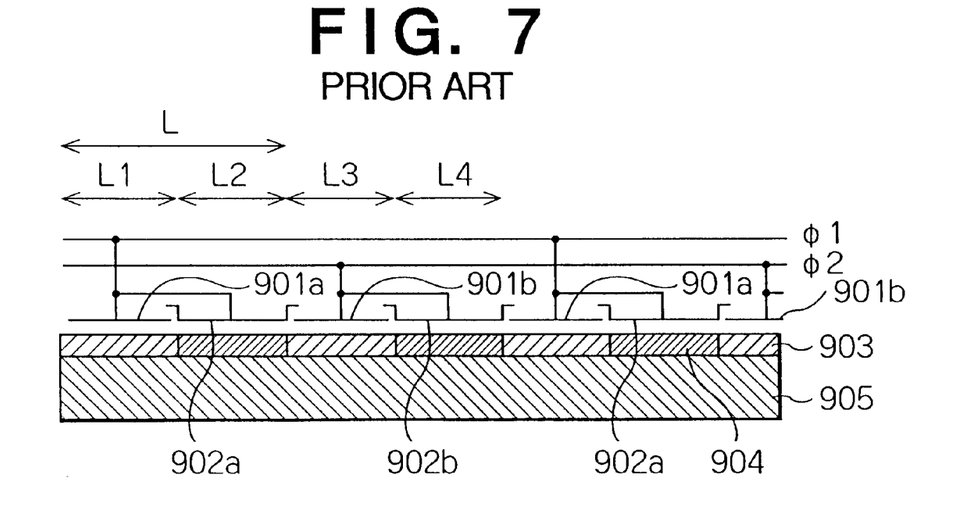
FIG. 7 is a schematic cross sectional view of the third conventional charge coupled device shown in FIG. 6.

In the technical field of solid-state imaging devices, the demand for greater charge transfer speed is increasing more and more. For example, in a horizontal charge transfer section such as shown in FIG. 7 of a solid-state imaging device having two horizontal charge transfer sections as shown in FIG. 6, the effective length of each charge transfer electrode is about 2 times that of the solid-state imaging device having a single horizontal charge transfer section shown in FIG. 1. Even if the scheme of second conventional charge coupled device is applied to such a solid-state imaging device having two horizontal charge transfer sections, the charge transfer speed cannot be improved to a sufficient level. Therefore, charge coupled devices having further improved transfer efficiency are desired.

Further, in the second conventional charge coupled device, since three diffused regions having different impurity concentrations are formed, a larger number of manufacturing steps are required compared to the first conventional charge coupled device. This also increases manufacturing costs.

SUMMARY OF THE INVENTION

In view of the foregoing, it is an object of the present invention to provide an improved charge coupled device which has an improved transfer efficiency and which can be manufactured by a relatively small number of manufacturing steps.

Another object of the present invention is to provide a method for manufacturing the charge coupled device as set forth above.

The present invention provides a charge coupled device which includes a charge transfer channel in which a plurality of first diffused regions and a plurality of second diffused regions having a conductivity type same as that of the first diffused regions and having a conductivity lower than that of the first diffused region are alternately formed along the charge transfer channel. The charge coupled device also includes first and second charge transfer electrodes which are formed in correspondence to the first and second diffused regions so as to control the electric potentials of the first and second diffused regions, respectively.

The first and second charge transfer electrodes are arranged alternately with each other to form a periodic structure in which one of the first charge transfer electrodes and a corresponding one of second charge transfer electrodes adjacent to each other are connected together to form an electrode pair, and a plurality of electrode groups each consisting of four successive electrode pairs including first through fourth electrode pairs are arranged along the charge transfer channel. The first electrode pair of each electrode group is connected to a first signal line, the third pair of each electrode group is connected to a second signal line, and the second and fourth pairs of each electrode group are maintained at a predetermined common potential.

In a preferred embodiment of the charge coupled device according to the present invention, a first driving signal having a waveform shifting periodically between an L-level and an H-level is supplied to the first signal line, and a second driving signal which is opposite in polarity to the first driving signal is supplied to the second signal line, for driving the charge coupled device with a two-phase driving signal. The predetermined common potential is determined substantially at an intermediate potential, e.g., a potential value between the L-level and the H-level.

In the method for driving the charge coupled device according to the present invention, it is preferred that each of the electric potentials of the first and second diffused regions controlled by the second and fourth electrode pairs be shallower than electric potentials of the first and second diffused regions created by an H-level supplied to the first and third electrode pairs and be deeper than electric potentials of the first and second diffused regions created by an L-level supplied to the first and third electrode pairs.

The present invention further provides a method for manufacturing the charge coupled device as set forth above. The method includes the steps of forming a first diffused region arranged at a constant pitch along a first direction in a substrate; forming a first insulating film on the first diffused region; forming a plurality of first charge transfer electrodes, on the first insulating film, overlying the first diffused region; forming a second insulating film on at least the surfaces of the first charge transfer electrodes; implanting impurity ions into portions of the first diffused region, on which the first charge transfer electrodes are not formed, thereby converting the portions of the first diffused region into a second diffused region having a conductivity smaller than a conductivity of the first impurity diffused region; forming a plurality of second charge transfer electrodes on the second insulating film overlying the second diffused region; and connecting the first and second charge transfer electrodes to each other through a wiring.

In the charge coupled device of the present invention, a common voltage can be applied to both the first and second charge transfer electrodes in each pair. As a result, the electric potential which is shallower than the electric potential of the channel region underlying the first charge transfer electrode is created in the corresponding channel region underlying the second charge transfer electrode. Accordingly, the region underlying each of the first charge transfer electrodes acts as an active charge storing region, and the region underlying each of the second charge transfer electrodes acts as a potential barrier region. The potential barrier region functions for preventing the signal charge from flowing in the reverse direction, thereby restricting the transfer direction of the signal charges to a specified direction.

In the charge coupled device of the present invention, the effective length of each charge transfer electrode can be decreased down to about a half that of the first conventional device and also can be decreased down to about ¾ that of the second conventional device. As a result, transfer of signal charges can be performed more efficiently compared to the first and second conventional devices.

The above and other objects, features and advantages of the present invention will be more apparent from the following description.

DESCRIPTION OF THE PREFERRED EMBODIMENTS

The present invention will now be described by way of preferred embodiment thereof with reference to the accompanying drawings. FIGS. 8A to 8D consecutively show the steps of a process for manufacturing the charge coupled device according to the preferred embodiment, which is of a so called buried channel/two-phase driven/two-layer electrode type.

Figure 8A:
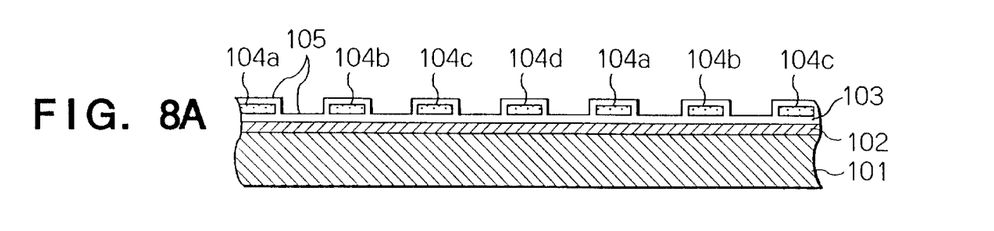
FIGS. 8A to 8D are cross sectional views consecutively showing steps of a process for manufacturing a charge coupled device according to an embodiment of the present invention.

Referring first to FIG. 8A, an N-conductive silicon layer (or impurity diffused region) 102 is formed on the surface of a P-type silicon substrate 101. Next, thermal oxidation is carried out to form a first insulating film 103 on the surface of N-diffused region 102. Subsequently, a pattern of a plurality of groups of first charge transfer electrodes 104a, 104b, 104c and 104d arranged at a constant pitch in the horizontal direction as viewed in the drawing (direction of the charge transfer channel) are formed by using a well known sputtering and patterning technique. Subsequently, first insulating film 103 is selectively removed by using the pattern of first charge transfer electrodes 104a, 104b, 104c and 104d as a mask, followed by a thermal oxidation to form a second insulating film 105 over the entire surface including the surfaces of regions of N-diffused layer 102 and the first charge transfer electrodes.

Figure 8B:
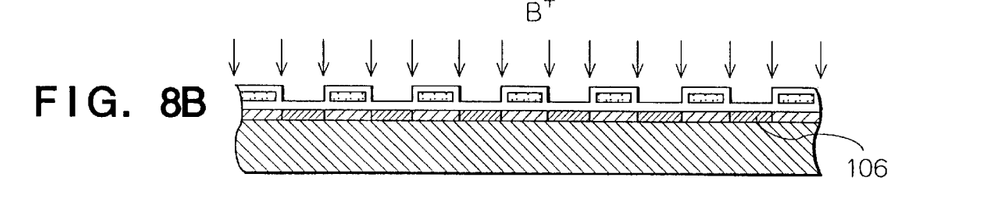

Next, P-type impurity ions (e.g., boron ions B$^+$) are lightly implanted (or doped) into the regions of N-diffused region 102 by using the pattern of first charge transfer electrodes 104a, 104b, 104c and 104d as a mask. As a result, N$^-$-diffused regions 106 are formed in self-alignment with first charge transfer electrodes 104a, 104b, 104c and 104d, as shown in FIG. 8B.

Figure 8C:
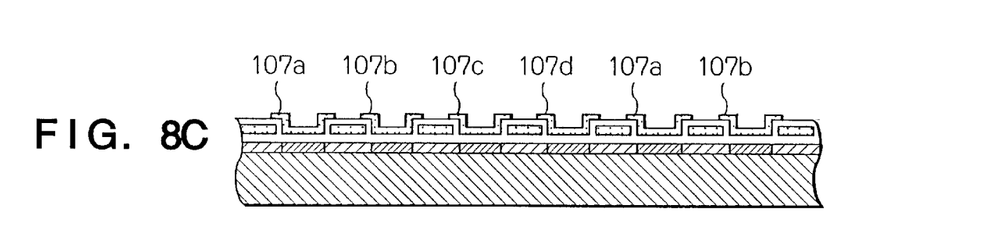

Subsequently, a pattern of a plurality of groups of second charge transfer electrodes 107a, 107b, 107c and 107d is formed on second insulating film 105 such that the pattern covers N$^-$-diffused region 106 and overlaps with the edges of first charge transfer electrodes 104a, 104b, 104c and 104d, as shown in FIG. 8C.

Figure 8D:
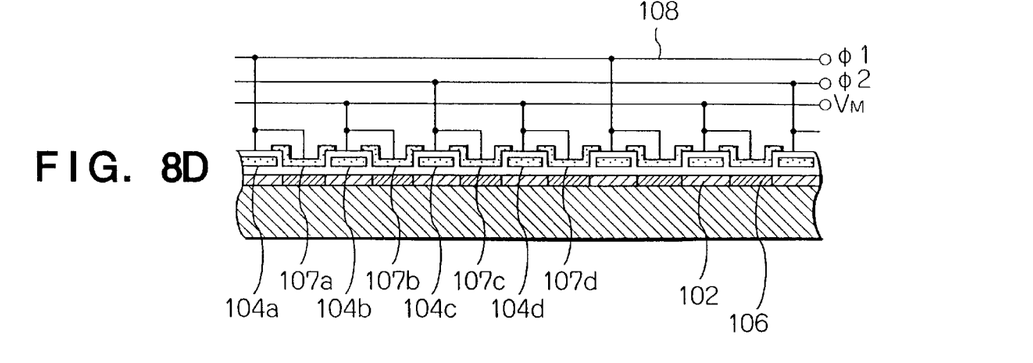

Thereafter, an interlayer insulating film (not shown) is formed, and a metallic wiring pattern 108 including first and second signal lines for receiving two-phase driving clock signals φ1 and φ2 is formed. The metallic wiring pattern 108 further includes a fixed potential line maintained at a predetermined electric potential $V_M$. The first and second charge transfer electrodes are connected such that each first charge transfer electrode is connected to a corresponding one of second charge transfer electrodes adjacent to the each first charge transfer electrode, thereby forming an electrode pair. Four successive electrode pairs constitute an electrode group and a plurality of iterative electrode groups are aligned in the direction of the charge transfer channel. The four electrode pairs in each group including first through fourth pairs as numberred from the left are connected to the metallic wiring pattern 108 such that the first through fourth pairs are connected to the first signal line (φ1), the fixed potential line ($V_M$), the second signal line (φ2) and the fixed potential line ($V_M$), respectively, as shown in FIG. 8D.

In the charge coupled device of the present embodiment manufactured in the manner as described above, two-phase clock signals φ1 and φ2 are applied to the respective signal lines. Clock signal φ1 has a waveform shifting between an H-level $V_H$ and an L-level $V_L$ at a duty ratio of 50%. Clock signal φ2 has a waveform similar to that of clock signal φ1 except for the polarity thereof that is opposite to the polarity of clock signal φ1.

The two-phase clock signals φ1 and φ2 control the electric potentials of a part of N-diffused regions 102 and a part of N$^-$-diffused regions 106 underlying the first and third electrode pairs 104a, 107a, 104c and 107c. These parts of diffused regions 102 and diffused regions 106 act as charge storage regions and barrier regions, respectively. Other parts of regions 102 and 106 underlying the second and fourth electrode pairs 104b, 107b, 104d, 107d maintained at the potential $V_M$ are maintained at a predetermined electric potential.

Figure 9A:
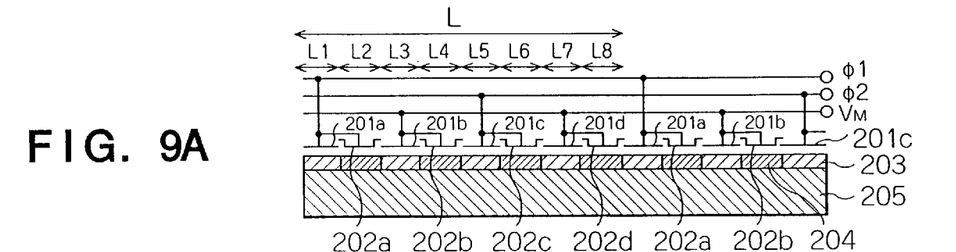
FIGS. 9A to 9E are a cross-sectional view, diagrams and a chart showing, similarly to FIGS. 3A to 3E, respectively, the operation of the charge coupled device of the embodiment manufactured by the steps of FIGS. 8A to 8D.

The operation of the charge coupled device of the present embodiment will be described with reference to FIGS. 9A to 9E showing similarly to FIGS. 3A to 3E, respectively, the operation of the charge coupled device of the present embodiment. Referring first to FIG. 9A, the charge coupled device has first charge transfer electrodes denoted by 201a, 201b, 201c and 201d, second charge transfer electrodes denoted by 202a, 202b, 202c and 202d, charge transfer channel including N-diffused regions denoted by 203 an N$^-$-diffused regions 204, and P-substrate 205.

Figure 9B:
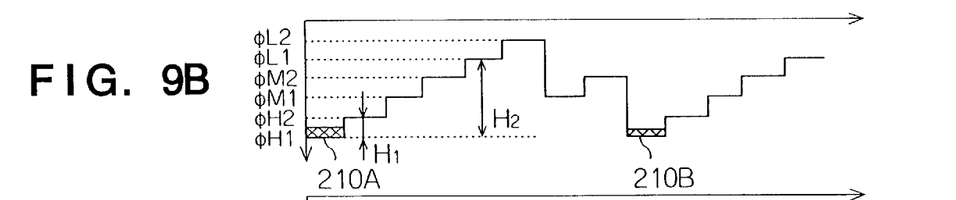
Figure 9C:
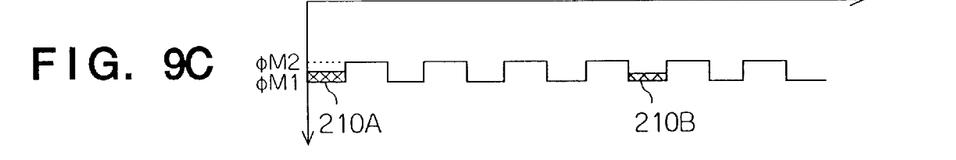
Figure 9D:
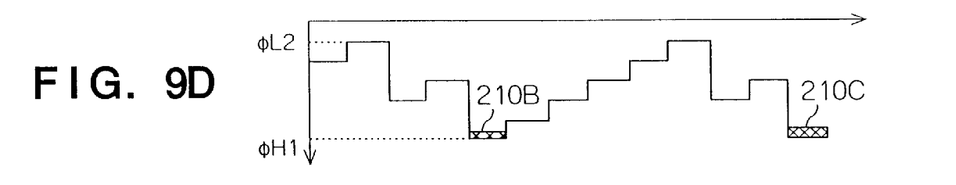
Figure 9E:
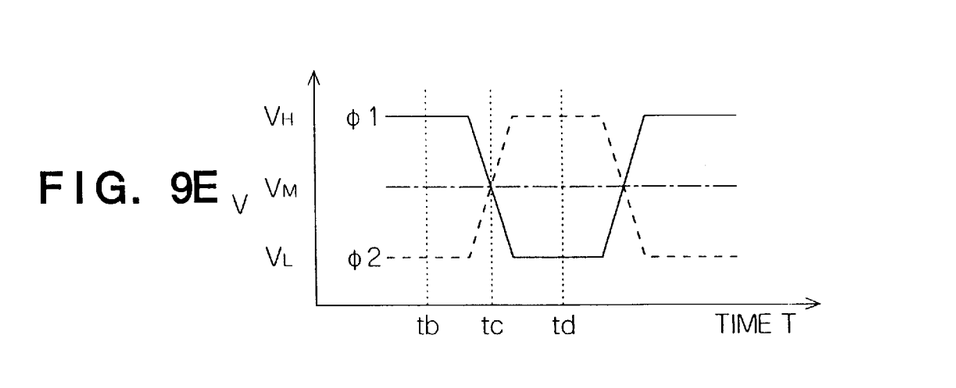

Referring next to FIG. 9E, two-phase clock signals φ1 and φ2 are maintained at an H-level $V_H$ and an L-level $V_L$, respectively, at time instant tb, at a middle electric potential $V_M$ between H-level $V_H$ and L-level $V_L$ at time instant tc, and at L-level $V_L$ and H-level $V_H$ at time instant td. The fixed potential line is maintained at the middle potential $V_M$ at all times. When the electrodes are maintained at the electric potentials $V_H$, the underlying N-diffused regions 203 are maintained at the deepest electric potentials $\phi_{H1}$ while the underlying N$^-$-diffused regions 204 are maintained at electric potentials $\phi_{H2}$ shallower (or higher in terms of potential value) than $\phi_{H1}$. When the electrodes are maintained at the electric potentials $V_M$, the underlying N-diffused regions are maintained at electric potentials $\phi_{M1}$ shallower than $\phi_{H2}$ while the underlying N$^-$-diffused regions are maintained at electric potentials $\phi_{M2}$ shallower than $\phi_{M1}$. When the electrodes are maintained at the electric potentials $V_L$, underlying N-type diffused regions are maintained at electric potentials $\phi_{L1}$ shallower than $\phi_{M2}$ while underlying N$^-$-diffused regions are maintained at electric potentials $\phi_{L2}$ shallower than $\phi_{L1}$. That is, the electric potentials has the relationship of $\phi_{H1} < \phi_{H2} < \phi_{M1} < \phi_{M2} < \phi_{L1} < \phi_{L2}$.

The channel regions underlying electrodes 201a, 202a, 201b, 202b, 201c, 202c, 201d and 202d which are arranged in this order from the left to the right in FIG. 9A are denoted by L1, L2, L3, L4, L5, L6, L7 and L8, respectively. By using this configuration, the potential distribution of the channel group for a single space period L including channel regions L1 to L8 appears iteratively along the charge transfer channel.

The electric potentials of channel regions L1 to L8 are denoted herein by $P_{L1}$ to $P_{L8}$, respectively. At time instant tb, as shown in FIG. 9B, the potential distribution of the charge transfer channel is such that the relationship $P_{L1}=\phi_{H1}<P_{L2}-\phi_{H2}<P_{L3}=\phi_{M1}<P_{L4}=\phi_{M2}<P_{L5}=\phi_{L1}<P_{L6}=\phi_{L2}$ holds, wherein $P_{L3}=P_{L7}$ and $P_{L4}=P_{L8}$. At this instant, signal charges 210A and 210B are stored in channel regions L1 having the deepest electric potentials and underlying first charge transfer electrode 201a of the first electrode pair. At time instant tc subsequent to time instant tb, as shown in FIG. 9C, the potential distribution is such that the relationship $P_{L1}=P_{L3}=P_{L5}=P_{L7}=\phi_{M1}<P_{L2}=P_{L4}=P_{L6}=P_{L8}=\phi_{M2}$ holds. At this time instant, signal charges 210A and 210B remain in channel regions L1 which are now at the deepest electric potentials.

At time instant td, as shown in FIG. 8D, the potential distribution of the charge transfer channel is such that the relationship $P_{L5}=\phi_{H1}<P_{L6}=\phi_{H2}<P_{L7}=\phi_{M1}<P_{L8}=\phi_{M2}<P_{L1}=\phi_{L1}<P_{L2}=\phi_{L2}$ holds, wherein $P_{L3}=P_{L7}$ and $P_{L4}=P_{L8}$. In accordance with the potential distribution falling as viewed leftward in the drawing from L1 to L5, each of signal charges 201A and 201B is transferred leftward. Specifically, each of signal charges 201A and 201B is transferred to channel region L5 having the deepest electric potential and is stored therein for a while. Subsequently, at the next time instant tb, the potential distribution shown in FIG. 9B is again obtained to further transfer the signal charges 210B and 210C leftward to the channel region L1 at which signal charges 210A and 210B are shown in FIG. 9B and which has the deepest electric potential at this instant. In this way, by iterating the above-described cycle, each of the signal charges is successively transferred leftward.

As described above, a common voltage is applied to both the first and second charge transfer electrodes of each pair. As a result, the potential of each of the odd numberred channel regions L1, L3, L5 and L7 formed of N-diffused region is slightly deeper than the potential of the adjacent one of the even numberred channel regions L2, L4, L6 and L8 formed of N⁻-diffused regions and located at the right side of each of the channel regions L1, L3, L5 and L7. In this way, each of the channel regions L1 and L5 underlying first charge transfer electrodes 201a and 201c functions as an active charge storage region while each of the adjacent channel regions L2 and L6 underlying second charge transfer electrodes 202a and 202c functions as a potential barrier region, which prevent the signal charges from flowing in the reverse direction to thereby restrict the transfer direction of the signal charges.

In the above embodiment, the effective length of each charge transfer electrode can be decreased to substantially half that of the first conventional device of FIG. 3A, and also can be decreased to substantially ¾ times that of the second conventional device of FIG. 5A. Accordingly, a fringe electric field, which plays an important role in the transfer of signal charges, can be increased in the present embodiment, and hence improves the transfer efficiency of the charge coupled device.

In comparison of the present embodiment with the first conventional charge coupled device, if the potential barrier height H1 from potential level $\phi_{H1}$ to potential level $\phi_{H2}$ in FIG. 9B is designed equal to the potential barrier height H1 as viewed from the potential at L1 to potential at L2 in FIG. 3B, the transfer speed of signal charges can be increased to about 8 times that of the first conventional device. Alternatively, if the potential barrier height H2 as viewed from $\phi_{H1}$ to $\phi_{L1}$ in FIG. 9B is designed equal to the potential barrier height H2 as viewed from the potential at L1 to the potential at L3 in FIG. 3B, the transfer speed of signal charges can be increased to substantially 4 times that of the first conventional device.

In comparison of 9B of the present embodiment with the second conventional charge coupled device, if the potential barrier height H1 in FIG. 9B is designed equal to the potential barrier height H1 in FIG. 5B, the transfer speed of signal charges in the present embodiment can be increased to about 2.4 times that of the second conventional device. Alternatively, if the potential barrier height H2 in FIG. 9B is designed equal to the potential barrier height H2 in FIG. 5B, the transfer speed of signal charges can be increased to about 1.8 times that of the second conventional device.

Hence, according to the present invention, there is provided a charge coupled device of a two-phase driven/two-layer type having a high transfer speed.

In the above embodiment, only two types of diffused regions having two different impurity concentrations are sufficient as channel regions. Therefore, unlike the second conventional device, the transfer speed can be increased without increasing the number of patterning and implanting steps. In addition, in the charge coupled device of the above embodiment, since the fixed voltage $V_M$ is applied to a half of the transfer electrodes so as to render those electrodes to operate as effective potential barrier electrodes, the load capacity for the driving signals can be reduced to about half that of the second conventional device.

Although a buried channel type charge coupled device has been described in the above embodiment, it is to be understood that the present invention can be also applied to surface channel type charge coupled devices, for example. Similarly, the conductivity types as described above are only examples and may be reversed in another embodiment.

Since the above embodiment is described only as an example, the present invention is not limited to such an embodiment and it will be obvious for those skilled in the art that various modifications or alterations can be easily made based on the above embodiment within the scope of the present invention.

What is claimed is:

1. A charge coupled device comprising a substrate, a charge transfer channel formed on said substrate, said charge transfer channel including a plurality of first diffused regions of a first conductivity type having a first conductivity and a plurality of second diffused regions of said first conductivity type, wherein said plurality of diffused regions have a second conductivity lower than said first conductivity, said first diffused regions and second diffused regions being arranged alternately one by one along said charge transfer channel, a plurality of first charge transfer electrodes each overlying a corresponding one of said first diffused regions, a plurality of second charge transfer electrodes each overlying a corresponding one of said second diffused regions, each of said first charge transfer electrodes being connected to an adjacent one of said second transfer electrodes to form an adjacent one of said second transfer electrodes to form an electrode pair, first through fourth said electrode pairs consecutively arranged forming an electrode group iteratively appearing along said charge transfer channel, a pair of first and second signal lines connected to each first electrode pair and each third electrode pair, respectively, of each said group, and a fixed potential line connected to each of second and fourth electrode pairs of each said group.

2. The charge coupled device as defined in claim 1 wherein said first signal line receives a first signal shifting iteratively between a first level and a second level lower than said first level, said second signal line receives a second signal shifting iteratively between said first level and second level and being opposite in polarity to said first signal, and said fixed potential line is maintained substantially at a middle potential between said first level and second level.

3. The charge coupled device as defined in claim 2 wherein said first conductivity and second conductivity are such that the electric potentials of said diffused regions underlying said second electrode pair and fourth electrode pair are shallower than the electric potentials of said diffused regions underlying said first electrode pair and third electrode pair, respectively, applied by said first level and are deeper than the electric potentials of said diffused regions underlying said first electrode pair and third electrode pair, respectively, applied by said second level.

4. The charge coupled device as defined in claim 1 herein said diffused regions are formed within a region of a second conductivity type.

\* \* \* \* \*